(12) United States Patent
Geneste et al.

(10) Patent No.: US 8,970,225 B2
(45) Date of Patent: Mar. 3, 2015

(54) EXCITATION CIRCUIT FOR DC SENSORS

(75) Inventors: Nicolas Geneste, Paris (FR); Gwenaël Esteve, Paris (FR)

(73) Assignee: Sagem Defense Securite, Paris (FR)

( * ) Notice: Subject to any disclaimer, the term of this patent is extended or adjusted under 35 U.S.C. 154(b) by 484 days.

(21) Appl. No.: 13/381,626

(22) PCT Filed: Jul. 5, 2010

(86) PCT No.: PCT/EP2010/059545
§ 371 (c)(1),
(2), (4) Date: Dec. 29, 2011

(87) PCT Pub. No.: WO2011/003852
PCT Pub. Date: Jan. 13, 2011

(65) Prior Publication Data
US 2012/0105077 A1    May 3, 2012

(30) Foreign Application Priority Data

Jul. 7, 2009 (FR) ...................................... 09 03338

(51) Int. Cl.
| | |
|---|---|
| *G01R 27/02* | (2006.01) |
| *G01R 31/08* | (2006.01) |
| *G01D 18/00* | (2006.01) |
| *G01R 31/02* | (2006.01) |

(52) U.S. Cl.
CPC ................ *G01D 18/00* (2013.01); *G01R 31/08* (2013.01); *G01R 31/025* (2013.01)
USPC ............................ 324/603; 324/604; 324/522

(58) Field of Classification Search
CPC ...... G01R 31/025; G01R 31/08; G01R 31/44; G01D 18/00
USPC .......................... 324/510, 511, 522, 603, 604
See application file for complete search history.

(56) References Cited

U.S. PATENT DOCUMENTS

| | | | | |
|---|---|---|---|---|
| 5,487,015 | A | * | 1/1996 | White ........................... 702/117 |
| 2006/0016259 | A1 | | 1/2006 | Smith | |

FOREIGN PATENT DOCUMENTS

| | | |
|---|---|---|
| EP | 1 361 118 A2 | 11/2003 |
| SU | 702379 | 12/1979 |

* cited by examiner

*Primary Examiner* — Amy He
(74) *Attorney, Agent, or Firm* — Muncy, Geissler, Olds & Lowe, P.C.

(57) ABSTRACT

A circuit for exciting at least one DC sensor is provided in which the circuit has a digital regulation controller connected to a main system and to a regulation loop. The main system has a DAC connected to the sensor via a non-inverted amplified path and via an inverted amplified path in order to send sensor excitation signals including a DC component in differential mode. The regulation system includes an ADC connected to the amplified paths. The circuit includes a monitoring system that is connected to the controller in parallel with the converter in order to send signals as a function of an AC component of the signals taken from the amplified paths. The digital controller is arranged to inject a sinewave in common mode into the excitation signals and to analyze signals output by the monitoring system and signals output by the ADC.

6 Claims, 1 Drawing Sheet

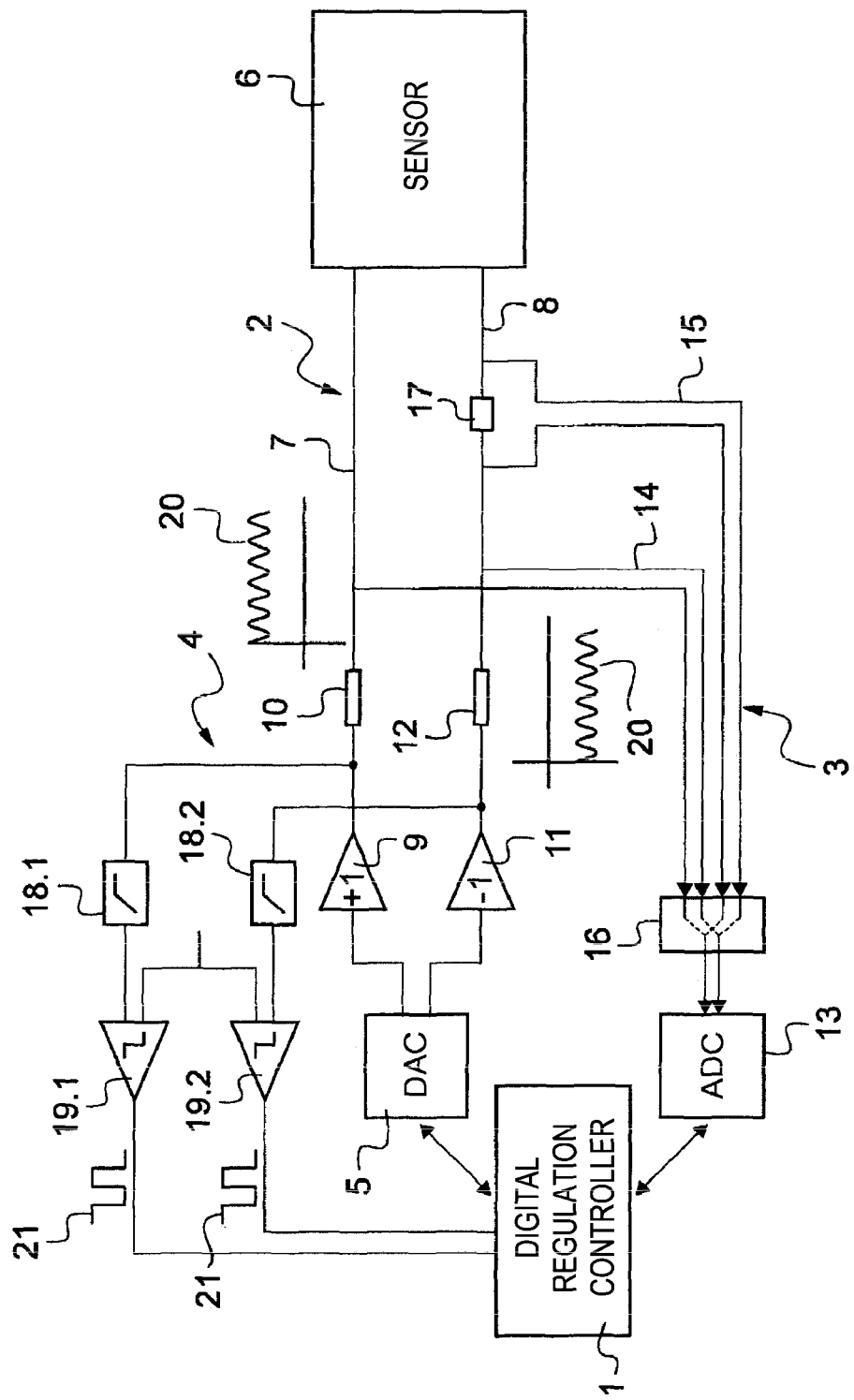

EXCITATION CIRCUIT FOR DC SENSORS

FIELD OF THE INVENTION

The present invention relates to a circuit for exciting direct current (DC) sensors. The excitation circuit is more particularly intended for incorporating in a device for controlling an aircraft engine.

BACKGROUND OF THE INVENTION

Such a control device includes a controller that determines in particular the flow rate of fuel as a function of the temperature of the engine, of pressures in the engine, and of the states of various engine components. For this purpose, the device includes excitation circuits and acquisition circuits that are connected to sensors including DC sensors such as thermocouple type temperature probes and strain gauges, that return respective DC signals of small amplitude.

In such an application, where a failure of the control device can have dramatic consequences for the operation of the aircraft, one of the main concerns is to detect faults and preferably to identify the faulty components.

At present, in the absence of such identification, the entire assembly comprising a sensor and the associated circuits is changed when a failure is detected. This gives rise to high costs.

Such detection and such identification may be performed using complex electronic components. Unfortunately increasing the complexity of electronic components has the effect of reducing their reliability of increasing their cost.

SUMMARY OF THE INVENTION

An object of the invention is to provide simple means enabling failures in an excitation circuit to be detected and identified.

To this end, the invention provides a circuit for exciting at least one DC sensor, the circuit comprising a digital regulation controller connected to a main system and to a regulation loop, the main system comprising a digital-to-analog converter (DAC) connected to the sensor via a non-inverted amplified path and via an inverted amplified path in order to send sensor excitation signals including a DC component in differential mode, the regulation system including an analog-to-digital converter (ADC) connected to the amplified paths, the circuit including a monitoring system that is connected to the controller in parallel with the converter in order to send signals as a function of an alternating current (AC) component of the signals taken from the amplified paths, the digital controller being arranged to inject a sinewave in common mode into the excitation signals and to analyze signals output by the monitoring system and signals output by the ADC.

Analyzing the signals from the monitoring system and from the regulation system makes it possible to reveal failures and to identify them. The sinewave does not disturb the operation of the sensor which is excited in differential mode, but serves to detect and identify failures. Thus, the monitoring system serves to verify the operation of the amplifiers by detecting their output signals, which signals are AC in normal operation and DC in the event of failure. The regulation system also serves to detect and identify failures. Thus, in normal operation, the regulation system sees only a DC signal, but in the event of one of the amplified paths being short-circuited to ground, the sinewave disappears from that amplified path, while remaining on the other amplified path, such that the sinewave appears in the regulation system. The regulation system also makes it possible to detect the presence of an open circuit (current is then zero) or a differential short circuit (voltage is then zero). Failures are thus detected with components that are simple. The digital regulation also makes it possible to have impedances between the digital controller and the sensor, thereby protecting the digital controller from lightning without having recourse to specific lightning arrestor devices, such as those of the Transorb type, whereas with conventional analog regulation, the presence of such impedances would lead to voltage drops that are harmful to the operation of the sensor and would therefore make it necessary to have recourse to specific lightning arrestor devices.

Preferably, the regulation loop comprises a current regulation path and a voltage regulation path, which paths are connected to the ADC via a selective connection switch.

The circuit may thus operate as a voltage source or as a current source depending on the sensors that are connected thereto.

BRIEF DESCRIPTION OF THE DRAWINGS

Other characteristics and advantages of the invention appear on reading the following description of particular, non-limiting embodiments of the invention.

Reference is made to the sole accompanying FIGURE that is a diagram of the circuit in accordance with the invention.

DETAILED DESCRIPTION OF THE PREFERRED EMBODIMENTS

The excitation circuit in accordance with the invention is intended more particularly for use in a device for controlling an aircraft engine on the basis of information coming from sensors incorporated in the engine and instructions from the pilot of the aircraft. The control device actuates a member for adjusting the rate at which fuel is introduced into the combustion chamber of the engine.

Such sensors include DC sensors that can be excited either at constant voltage, such as pressure sensors (such as voltage-excited strain gauges), or at constant current such as temperature sensors (such as current-excited platinum probes). The excitation circuit in the preferred embodiment of the invention is arranged to be equally capable of exciting sensors of either of those types.

The excitation circuit includes a digital regulation calculator 1 (or digital core) connected to a main system, to a regulation loop, and to a monitoring system, given respective overall references 2, 3, and 4.

The main system 2 comprises a DAC 5 connected to the sensor 6 via a non-inverted amplified path 7 and via an inverted amplified path 8. The non-inverted amplified path 7 includes a non-inverting amplifier 9 and an impedance 10 that are connected in series between the DAC 5 and the sensor 6. The inverted amplified path 8 includes an inverting amplifier 11 and an impedance 12 that are connected in series between the DAC 5 and the sensor 6. The impedances 10 and 12 provide the digital regulation controller 1 with lightning protection.

The regulation loop 3 comprises an analog-to-digital converter (ADC) 13 connected to the amplified paths 7 and 8 downstream from the impedances 10 and 12 by a voltage regulation loop 14 and a current regulation loop 15, which loops are connected to the ADC 13 via a selective connection switch 16 or multiplexer. The voltage regulation loop 14 comprises two paths connected to the selective connection switch 16 and to respective ones of the amplified paths 7 and 8. The current regulation loop comprises two paths connected to the selective connection switch 16 and firstly to the amplified path 8 and secondly to a resistor 17 that is connected in series in the path 8 in order to provide a current-to-voltage converter. The selective connection switch 16 serves to connect the ADC 13 either to the current regulation loop or to the voltage regulation loop depending on the type of sensor 6 that is connected to the amplified paths 7 and 8.

The monitoring system 4 comprises two paths 4.1 and 4.2, each connected to the digital regulation controller 1 and to a respective one of the amplified paths 7 and 8 between the corresponding amplifier 9, 11 and impedance 10, 12. Each of the paths includes respective highpass filters 18.1, 18.2 and respective comparators 19.1, 19.2 for comparing the signals output by the highpass filter 18.1, 18.2 with a reference. The comparators 19 and the highpass filters 18 are connected to the digital regulation controller 1 in parallel with the DAC 5 in order to compare the reference with an AC component of each of the signals taken from the amplified paths 7 and 8 at the outputs from the amplifiers 9 and 11. The highpass filters 18 serve to eliminate the DC component from each of the signals taken from the amplified paths 7 and 8.

The digital regulation controller 1 is arranged to send excitation signals over the amplified paths 7 and 8 for exciting the sensor 6 in differential mode, and to analyze the signals output by the ADC 13.

The excitation signals are determined from a measurement performed at the output of the ADC 13, either a voltage measurement or a current measurement depending on the sensor 6. Digital regulation enables the excitation circuit to be versatile, and it is possible to change the sensor 6 without changing the excitation circuit. The excitation circuit is arranged to detect and identify faults, i.e. internal faults (faults in the active components of the excitation circuit such as the converters and the amplifiers) and external faults (open circuit, differential short circuit, and short circuit to ground).

The digital regulation controller 1 is arranged for this purpose to inject a common-mode sinewave 20 into the excitation signals sent over the amplified paths 7 and 8 so as to be able to analyze signals at the outputs from the comparators 19.

The sinewave does not disturb the sensor, which is subjected only to the DC component of the excitation signals in differential mode.

Analyzing the signals output by the comparators 19 makes it possible to detect internal faults. In normal operation, the signals output by the comparators are normally AC signals of sinusoidal type, here squarewave signals 21. These signals result from comparing and filtering the signals taken from the output of the amplifiers 9 and 11. In the event of an internal fault, the signals at the outputs from the comparators 19 are constant.

Analyzing the signals from the output of the ADC 13 serves to detect and identify external faults. The regulation loop 4 serves to measure voltage between the impedances 11 and 12 and the sensor 6. The output signals from the comparators 19 serve to determine the output voltage from the amplifiers 9 and 10. It is then possible to calculate the voltage drops caused from the impedances and from the current drawn by the sensor 6. Too small a current or indeed zero current indicates an open circuit, while too great a current and zero voltage indicates a differential short circuit. The digital controller thus compares the output signals from the monitoring system with the output signals from the regulation loop in order to detect voltage and current differences.

It is not obvious how to detect short circuits to ground in airplanes since ground is not at the same potential throughout.

The regulation loop 3 here serves to detect such short circuits to ground. In normal operation, the regulation loop 3 sees only the DC component, the alternative component being eliminated by the fact that it is present on both amplified paths. However, if one of the amplified paths is short-circuited to ground, then the sinewave disappears on that path while remaining on the other amplified path. The AC component then appears in the regulation loop 4. The ADC 13 recovers the DC component by averaging (lowpass filtering) and the AC component by digital demodulation. The digital demodulation is digital demodulation that is performed synchronously with a frequency that corresponds to the frequency of the sinewave in order to eliminate noise. If the sinewave signal resulting from synchronous demodulation presents an amplitude greater than a threshold, then there is a short circuit to ground. The sign of the sinewave is also verified by the digital regulation controller 1 since it serves to detect which path is connected to ground.

The following table summarizes the logic whereby the various potential faults are detected.

|  | Voltage measurement V | Current measurement I | Comparator signals |
|---|---|---|---|
| Normal operation | V ≠ 0 | I ≠ 0 | Squarewave signal |
| Open circuit | V ≠ 0 | I = 0 | Squarewave signal |
| Differential short circuit | V = 0 | I ≠ 0 | Squarewave signal |
| Short circuit to ground | V = 0 + AC signal | I ≠ 0 | Squarewave signal |
| Driver fault | V ≠ nominal voltage | I ≠ nominal current | DC signal |

Naturally, the invention is not limited to the above-described embodiments but covers any variant coming within the scope of the invention as defined by the claims.

In particular, the excitation circuit in accordance with the invention may be used with one or more constant voltage sensors and/or constant current sensors.

Although the invention is described in an aviation application, the invention is applicable to exciting any type of DC detector for use in engine regulation or for any other type of control.

The excitation circuit may include only one voltage regulation loop or only one current regulation loop.

What is claimed is:

1. A circuit for exciting at least one direct current (DC) sensor, the circuit comprising:
   a digital regulation controller connected to a main system and to a regulation loop;
   wherein the main system comprises a digital-to-analog converter (DAC) connected to the sensor via a non-inverted amplified path and via an inverted amplified path in order to send sensor excitation signals including a DC component in differential mode;
   wherein the regulation loop includes an analog-to-digital converter (ADC) connected to the amplified paths;
   a monitoring system that is connected to the digital regulation controller in parallel with the analog-to-digital (ADC) converter in order to send signals as a function of an alternating current (AC) component of the signals taken from the amplified paths; and
   wherein the digital regulation controller is arranged to inject a sinewave in common mode into the excitation signals and to analyze signals output by the monitoring system and signals output by the ADC.

2. The circuit according to claim 1, wherein the monitoring system includes comparators for comparing the AC component with a reference.

3. The circuit according to claim 2, wherein the monitoring system includes filters for eliminating the DC components from the signals taken from the amplified path.

4. The circuit according to claim 1, wherein the ADC 13 recovers the DC components from the excitation signals by averaging and their AC components by digital demodulation that is synchronous with a frequency of the sinewave, and the digital controller is arranged to compare the sinewave signal that results from the synchronous demodulation with a threshold and to verify the sign of the sinewave signal.

5. The circuit according to claim 1, wherein the digital controller is arranged to compare the output signals from the monitoring system and the output signals from the regulation loop in order to detect a voltage and current difference.

6. The circuit according to claim 1, wherein the regulation loop comprises a current regulation path and a voltage regulation path, which paths are connected to the ADC via a selective connection switch.

* * * * *